United States Patent
Heo et al.

(10) Patent No.: US 9,831,291 B2
(45) Date of Patent: Nov. 28, 2017

(54) ORGANIC LIGHT EMITTING DISPLAY DEVICE AND METHOD OF MANUFACTURING THE SAME

(71) Applicant: LG Display Co., Ltd., Seoul (KR)

(72) Inventors: Jeong-Haeng Heo, Paju (JP);
Jeong-Dae Seo, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/649,550

(22) Filed: Jul. 13, 2017

(65) Prior Publication Data
US 2017/0309686 A1    Oct. 26, 2017

Related U.S. Application Data

(62) Division of application No. 14/135,426, filed on Dec. 19, 2013, now Pat. No. 9,735,206.

(30) Foreign Application Priority Data

Dec. 28, 2012  (KR) .................. 10-2012-0155900
Jul. 29, 2013  (KR) .................. 10-2013-0089383

(51) Int. Cl.
*H01L 29/08*  (2006.01)
*H01L 27/32*  (2006.01)
*H01L 51/50*  (2006.01)

(52) U.S. Cl.
CPC ........ *H01L 27/3209* (2013.01); *H01L 27/322* (2013.01); *H01L 51/504* (2013.01); *H01L 51/5056* (2013.01); *H01L 2251/558* (2013.01)

(58) Field of Classification Search
CPC .............. H01L 27/3209; H01L 51/504; H01L 2251/558; H01L 51/5056; H01L 51/5036; H01L 51/5278
See application file for complete search history.

(56) References Cited

U.S. PATENT DOCUMENTS

| | | | |
|---|---|---|---|
| 2005/0140275 A1* | 6/2005 | Park .................. | H01L 27/3209 313/504 |
| 2006/0186793 A1* | 8/2006 | Iou ..................... | H01L 51/5036 313/503 |
| 2009/0302758 A1 | 12/2009 | Saitoh et al. | |
| 2011/0215714 A1* | 9/2011 | Seo ..................... | C09K 11/06 313/504 |

(Continued)

FOREIGN PATENT DOCUMENTS

CN  101006594 A  7/2007
CN  101427398 A  5/2009

(Continued)

OTHER PUBLICATIONS

Office Action for Chinese Patent Application No. CN 201310726985.1, Oct. 2015, 19 Pages.

(Continued)

*Primary Examiner* — Allen Parker
*Assistant Examiner* — Frederick B Hargrove
(74) *Attorney, Agent, or Firm* — Fenwick & West LLP

(57) ABSTRACT

An organic light emitting display device includes first and second electrodes facing each other on a substrate, a charge generation layer formed between first and second electrodes, a first light emitting unit including a first emission layer formed between the first electrode and the charge generation layer, a hole transport layer supplying holes from the first electrode to the first emission layer, and a second light emitting unit including a second emission layer formed between the second electrode and the charge generation layer, a hole transport layer supplying holes from the charge generation layer to the second emission layer, wherein a total thickness of the hole transport layer of the first light emitting unit is greater than that of the hole transport layer of the second light emitting unit.

3 Claims, 7 Drawing Sheets

(56) References Cited

U.S. PATENT DOCUMENTS

| | | |
|---|---|---|
| 2011/0248253 A1 | 10/2011 | Yamana et al. |
| 2012/0049165 A1 | 3/2012 | Jou et al. |
| 2012/0098012 A1 | 4/2012 | Kim et al. |
| 2012/0248971 A1 | 10/2012 | Okuyama |
| 2012/0326132 A1 | 12/2012 | Ko et al. |
| 2013/0241401 A1 | 9/2013 | Kwong et al. |
| 2013/0285039 A1* | 10/2013 | Ishihara ............ H01L 51/5265 257/40 |

FOREIGN PATENT DOCUMENTS

| | | | |
|---|---|---|---|
| CN | 102456840 | 5/2012 | |
| EP | 1030382 | 8/2000 | |
| JP | 2009-301731 | 12/2009 | |
| TW | 200847837 | 12/2008 | |
| WO | WO 2012102243 A1 * | 8/2012 | ......... H01L 51/5265 |
| WO | WO 2012128078 | 9/2012 | |

OTHER PUBLICATIONS

Office Action for Taiwanese Patent Application No. TW 102146427, Sep. 7, 2015, 17 Pages.

Qiao, X-F. et al., "Comparative Study on Hole Transport in N, N'-bis(naphthalene-l-yl)-N,N'-bis(phey) Benzidine and 4, 4', 4"-tri(N-carbazolyl)triphenylamine," Chin. Phys. Lett., 2010, pp. 088504-1-088504-4, vol. 27, No. 8.

Haldi, A. et al., "Highly efficient green phosphorescent organic light-emitting diodes with simplified device geometry," Appl. Physc. Lett., 2008, pp. 253502-1-253502-3, vol. 92.

Office Action for U.S. Appl. No. 14/135,426, dated Nov. 25, 2016, 30 Pages.

Office Action for U.S. Appl. No. 14/135,426, dated May 12, 2016, 15 Pages.

Office Action for U.S. Appl. No. 14/135,426, dated Oct. 28, 2015, 18 Pages.

* cited by examiner

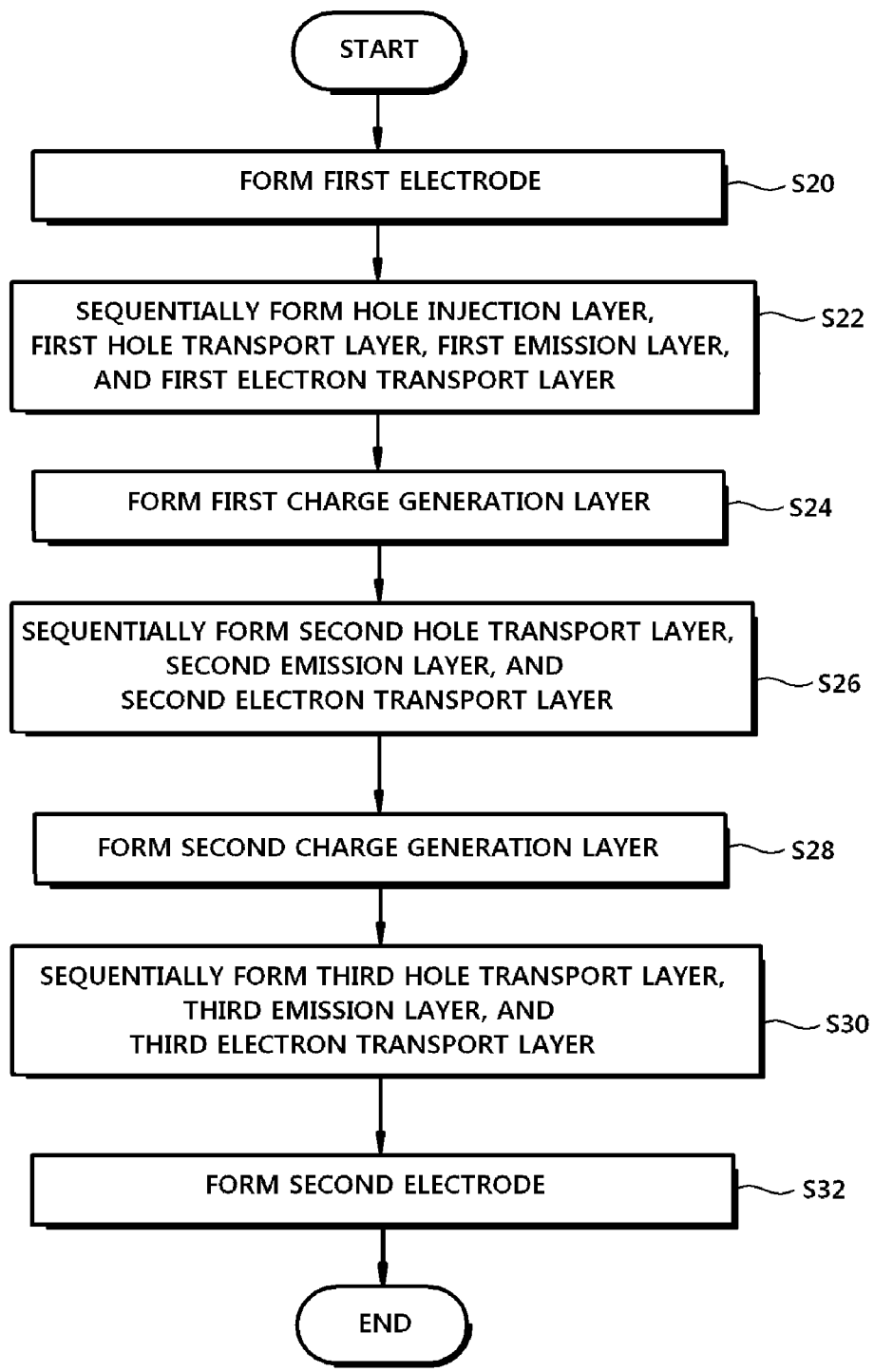

ORGANIC LIGHT EMITTING DISPLAY DEVICE AND METHOD OF MANUFACTURING THE SAME

CROSS-REFERENCE TO RELATED APPLICATIONS

This application is a divisional application of U.S. patent application Ser. No. 14/135,426 filed on Dec. 19, 2013, which claims the benefit of Korean Patent Applications No. 10-2012-0155900 filed on Dec. 28, 2012, and No. 10-2013-0089383 filed on Jul. 29, 2013, all of which are hereby incorporated by reference as if fully set forth herein.

BACKGROUND OF THE INVENTION

Field of the Invention

The present invention relates to an organic light emitting display device with enhanced lifespan and efficiency and a method of manufacturing the same.

Discussion of the Related Art

In line with the recent information era, the display field, which visually displays electrical information signals, has rapidly developed. To meet such development, various flat panel display devices with excellent performance, such as ultra-thin in thickness, lightweight, and low power consumption, have been developed.

Examples of flat panel display devices include, without being limited to, a liquid crystal display (LCD) device, a plasma display panel (PDP) device, a field emission display (FED) device, and an organic light emitting device (OLED).

In particular, OLEDs, which are self-emissive devices, have faster response time, higher luminous efficiency, higher luminance and wider viewing angles than other flat panel display devices.

However, OLEDs have shorter lifespan and lower efficiency than other flat panel display devices. Therefore, there is a need to improve OLED lifespan and efficiency.

SUMMARY OF THE INVENTION

Accordingly, the present invention is directed to an organic light emitting display device and a method of manufacturing the same that substantially obviate one or more problems due to limitations and disadvantages of the related art.

An object of the present invention is to provide an organic light emitting display device with enhanced lifespan and efficiency and a method of manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device includes first and second electrodes facing each other on a substrate, a charge generation layer formed between the first and second electrodes, a first light emitting unit including a first emission layer formed between the first electrode and the charge generation layer, a hole transport layer supplying holes from the first electrode to the first emission layer, and a first electron transport layer supplying electrons from the charge generation layer to the first emission layer, and a second light emitting unit including a second emission layer formed between the second electrode and the charge generation layer, a hole transport layer supplying holes from the charge generation layer to the second emission layer, and a second electron transport layer supplying electrons from the second electrode to the second emission layer, wherein a total thickness of the hole transport layer of the first light emitting unit is greater than that of the hole transport layer of the second light emitting unit.

The hole transport layer of the first light emitting unit may include a first hole transport layer and a second hole transport layer that is thinner than the first hole transport layer, and the hole transport layer of the second light emitting unit may include a third hole transport layer and a fourth hole transport layer that is thinner than the third hole transport layer, wherein a sum of thicknesses of the first and second hole transport layers is greater than a sum of thicknesses of the third and fourth hole transport layers.

The thickness of the first hole transport layer may be greater than the thickness of the third hole transport layer.

The first hole transport layer may have a thickness of 700 Å to 1200 Å, the second hole transport layer may have a thickness of 150 Å to 250 Å, the third hole transport layer may have a thickness of 250 Å to 350 Å, and the fourth hole transport layer may have a thickness of 100 Å to 150 Å.

A hole mobility of the first hole transport layer may be higher than that of the second hole transport layer, and a hole mobility of the third hole transport layer may be higher than that of the fourth hole transport layer.

The hole mobility of the third hole transport layer may be higher than that of the first hole transport layer.

The organic light emitting display device may further include a second charge generation layer formed on the second electron transport layer of the second light emitting unit and a third light emitting unit formed between the second charge generation layer and the second electrode, wherein the third light emitting unit includes a third emission layer formed between the second electrode and the second charge generation layer, a hole transport layer supplying holes from the second charge generation layer to the third emission layer, and a third electron transport layer supplying electrons to the third emission layer, and a total thickness of the hole transport layer of the first light emitting unit is greater than that of the hole transport layer of the third light emitting unit, and the thickness of the hole transport layer of the third light emitting unit is greater than that of the hole transport layer of the second light emitting unit.

The thickness of the hole transport layer of the first light emitting unit may be between 1050 Å and 1450 Å, the thickness of the hole transport layer of the second light emitting unit may be between 200 and 600 Å, and the thickness of the hole transport layer of the third light emitting unit may be between 800 and 1000 Å.

Two of the first, second and third emission layers may realize blue color, and the other thereof may realize green color.

In another aspect of the present invention, a method of manufacturing an organic light emitting display device includes forming a first electrode on a substrate; forming, on the first electrode, a first light emitting unit including a first emission layer, a hole transport layer supplying holes from the first electrode to the first emission layer, and a first electron transport layer supplying electrons to the first emission layer, forming a charge generation layer supplying the electrons to the first electron transport layer, on the first light emitting unit, forming, on the charge generation layer, a second light emitting unit including a second emission layer, a hole transport layer supplying holes from the charge generation layer to the second emission layer, and a second electron transport layer supplying electrons to the second emission layer, and forming a second electrode supplying the electrons to the second electron transport layer, on the second light emitting unit, wherein a total thickness of the hole transport layer of the first light emitting unit is greater than that of the hole transport layer of the second light emitting unit.

The method may further include forming, on the second light emitting unit, a second charge generation layer supplying the electrons to the second electron transport layer and forming, on the second charge generation layer, a third light emitting unit including a third emission layer, a hole transport layer supplying holes from the second charge generation layer to the third emission layer, and a third electron transport layer supplying electrons to the third emission layer, wherein a thickness of the hole transport layer of the first light emitting unit is greater than that of the hole transport layer of the third light emitting unit, and the thickness of the hole transport layer of the third light emitting unit is greater than that of the hole transport layer of the second light emitting unit.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 8 is a flowchart for explaining a method of manufacturing the organic light emitting display device according to the second embodiment of the present invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Figure 1:
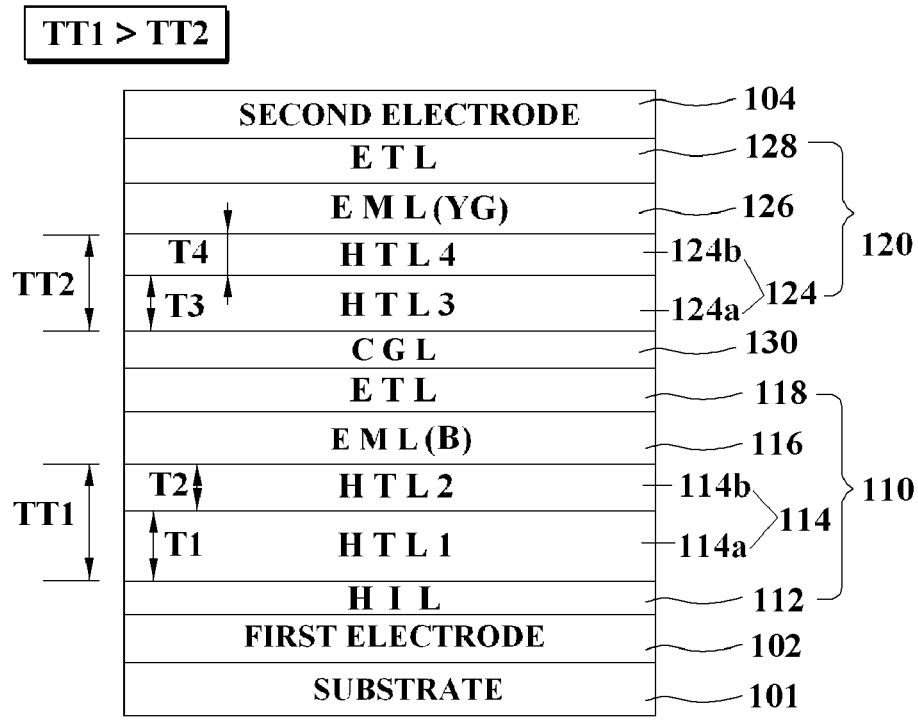
FIG. 1 is a sectional view of an organic light emitting display device according to a first embodiment of the present invention.
Figure 2:
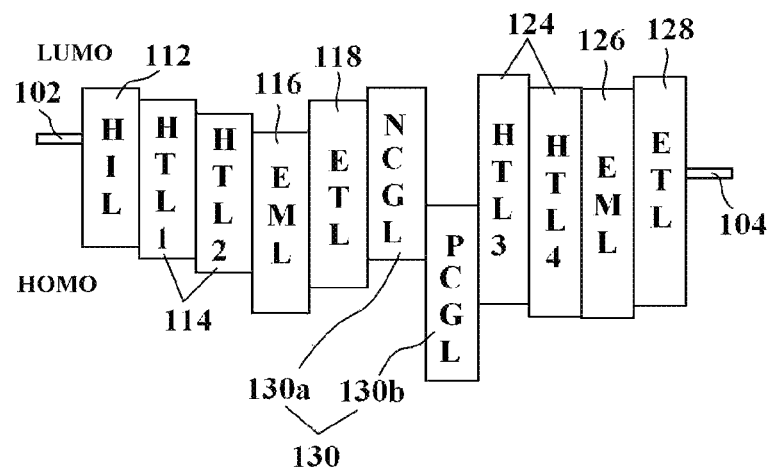
FIG. 2 is a band diagram illustrating the organic light emitting display device illustrated in FIG. 1.

FIG. 1 is a sectional view of an organic light emitting display device according to a first embodiment of the present invention. FIG. 2 is a band diagram illustrating the organic light emitting display device illustrated in FIG. 1.

Referring to FIGS. 1 and 2, the organic light emitting display device includes first and second electrodes 102 and 104 facing each other, first and second light emitting units 110 and 120 disposed between the first and second electrodes 102 and 104, and a charge generation layer 130 disposed between the first and second light emitting units 110 and 120. In the present embodiment, two light emitting units are formed, but embodiments are not limited thereto. That is, three or more light emitting units may be formed.

Any one of the first and second electrodes 102 and 104 is formed as a semi-transparent electrode and the other thereof is formed as a reflective electrode. When the first electrode 102 is a semi-transparent electrode and the second electrode 104 is a reflective electrode, the organic light emitting display device is embodied as a bottom emission type that emits light in a bottom direction. When the second electrode 104 is a semi-transparent electrode and the first electrode 102 is a reflective electrode, the organic light emitting display device is embodied as a top emission type that emits light in a top direction. In the present invention, a case in which the first electrode 102 as an anode is formed as a reflective electrode and the second electrode 104 as a cathode is formed as a semi-transparent electrode will be described by way of example.

The first electrode 102 is formed as multiple layers including a metal layer formed of aluminum (Al) or an Al alloy (e.g., AlNd) and a transparent layer formed of indium tin oxide (ITO), indium zinc oxide (IZO), or the like and serves as a reflective electrode.

The second electrode 104 is formed as a single layer or multiple layers, and each layer constituting the second electrode 104 is formed of a metal, an inorganic material, a mixture of metals, a mixture of a metal and an inorganic material, or a mixture thereof. When each layer is formed of the mixture of a metal and an inorganic material, a mix ratio thereof is 10:1 to 1:10 and, when each layer is formed of the mixture of metals, a mix ratio thereof is 10:1 to 1:10. The metal constituting the second electrode 104 may be Ag, Mg, Yb, Li, or Ca, the inorganic material constituting the second electrode 104 may be $Li_2O$, CaO, LiF, or $MgF_2$, and the metal and the inorganic material facilitate migration of electrons and thus enable a large amount of electrons to be supplied to an emission layer 110.

The charge generation layer 130 generates and separates n-type charges, i.e., electrons, and p-type charges, i.e., holes. For this operation, the charge generation layer 130 includes an N-type charge generation layer 130a formed on a first electron transport layer 118 of the first light emitting unit 110 and a P-type charge generation layer 130b formed below a third hole transport layer 124a of the second light emitting unit 120. The N-type charge generation layer 130a injects electrons into the first light emitting unit 110, and the injected electrons and holes transferred from the first electrode 102 are combined in a first emission layer 116 of the first light emitting unit 110, forming excitons and releasing energy, whereby visible light is emitted. The P-type charge generation layer 130b injects holes to the second light emitting unit 120, and the injected holes and electrons transferred from the second electrode 104 are combined in a second emission layer 126, forming excitons and releasing energy, whereby visible light is emitted.

In this regard, the first emission layer 116 may include a fluorescent blue dopant and host to emit blue light, and the second emission layer 126 may include a phosphorescent yellow-green dopant and host to emit orange light, which enables emission of white light. In addition, white light may be generated using other fluorescent dopants and phosphorescent dopants.

The first light emitting unit 110 is formed between the first electrode 102 and the charge generation layer 130. The first light emitting unit 110 includes a hole injection layer 112, first and second hole transport layers 114a and 114b, the first emission layer 116, and a first electron transport layer 118 that are sequentially formed on the first electrode 102. The first and second hole transport layers 114a and 114b supply holes from the first electrode 102 to the first emission layer 116, the first electron transport layer 118 supplies electrons from the charge generation layer 130 to the first emission layer 116, and the holes supplied via the first and second hole transport layers 114a and 114b and the electrons supplied via the first electron transport layer 118 are recombined in the first emission layer 116, whereby light is emitted.

In particular, the first hole transport layer 114a supplies holes from the first electrode 102 to the second hole transport layer 114b and controls cavity of blue light generated from the first light emitting unit 110. The first hole transport layer 114a is formed of a material with less variation in hole mobility ($5.0 \times 10^{-3}$ Vs/cm$^2$) according to thickness. For example, the first hole transport layer 114a is formed of at least one material selected from among rubrene, NPB, TBP, TAPC, TCTA, and 2-TMATA. In this regard, the first hole transport layer 114a has a thickness of about 700 Å to about 1200 Å.

The second hole transport layer 114b supplies holes from the first hole transport layer 114a to the first emission layer 116 and controls cavity of blue light generated from the first light emitting unit 110. In addition, the second hole transport layer 114b blocks electrons supplied to the first emission layer 116. In this regard, the second hole transport layer 114b is formed of a material having a lower hole mobility than that of the first hole transport layer 114a and blocks electrons so that electrons supplied to the first emission layer 116 are not transferred to other layers and combined with holes in the first emission layer 116. For example, the second hole transport layer 114b is formed of at least one of rubrene, NPB, TBP, TAPC, TCTA, and 2-TMATA.

Meanwhile, since the hole mobility of the second hole transport layer 114b is lower than that of the first hole transport layer 114a, when the thickness of the second hole transport layer 114b increases, driving voltage increases and lifespan decreases. Thus, the second hole transport layer 114b has a thickness of about 150 Å to about 250 Å, which is smaller than that of the first hole transport layer 114a.

The second light emitting unit 120 is formed between the second electrode 104 and the charge generation layer 130. The second light emitting unit 120 includes third and fourth hole transport layers 124a and 124b, the second emission layer 126, and a second electron transport layer 128 that are sequentially formed on the charge generation layer 130. The third and fourth hole transport layers 124a and 124b supply holes from the charge generation layer 30 to the second emission layer 126, the second electron transport layer 128 supplies electrons from the second electrode 132 to the second emission layer 126, and the holes supplied via the third and fourth hole transport layers 124a and 124b and the electrons supplied via the second electron transport layer 128 are recombined in the second emission layer 126, thereby generating light.

In particular, the third hole transport layer 124a supplies holes from the charge generation layer 130 to the fourth hole transport layer 124b and controls cavity of orange light generated from the second light emitting unit 120. Since the holes transferred from the charge generation layer 130 are injected into the third hole transport layer 124a and thus the third hole transport layer 124a is formed of a material having a higher hole mobility than that of the first and second hole transport layers 114a and 114b. For example, the third hole transport layer 124a is formed of at least one material selected from among rubrene, NPB, TBP, TAPC, TCTA, and 2-TMATA. In this regard, the third hole transport layer 124a has a thickness of about 250 Å to about 350 Å.

The fourth hole transport layer 124b supplies holes from the third hole transport layer 124a to the second emission layer 126 and controls cavity of orange light generated from the second light emitting unit 120. In addition, the fourth hole transport layer 124b has a higher triplet energy level T1 (e.g., 2.5) than that of the second emission layer 126 so as to block electrons supplied to the second emission layer 126.

In this regard, the fourth hole transport layer 124b is formed of a material having a lower hole mobility than that of the third hole transport layer 124a. For example, the fourth hole transport layer 124b is formed of at least one of rubrene, NPB, TBP, TAPC, TCTA, and 2-TMATA.

Meanwhile, since the hole mobility of the fourth hole transport layer 124b is lower than that of the third hole transport layer 124a, when the thickness of the fourth hole transport layer 124b increases, driving voltage increases and lifespan decreases. Thus, the fourth hole transport layer 124b has a thickness of about 100 Å to about 150 Å, which is smaller than the thickness of the third hole transport layer 124a.

In the organic light emitting display device according to the first embodiment of the present invention, the thicknesses of the first, second, third and fourth hole transport layers 114a, 114b, 124a and 124b satisfy conditions shown in Equation 1 below.

$$TT1(=T1+T2)>TT2(=T3+T4) \qquad \text{[Equation 1]}$$

In Equation 1, T1 denotes the thickness of the first hole transport layer 114a, T2 denotes the thickness of the second hole transport layer 114b, T3 denotes the thickness of the third hole transport layer 124a, T4 denotes the thickness of the fourth hole transport layer 124b, TT1 denotes a sum of the thicknesses of the first and second hole transport layers 114a and 114b, i.e., a total thickness of a hole transport layer of the first light emitting unit 110, and TT2 denotes a sum of the thicknesses of the third and fourth hole transport layers 124a and 124b, i.e., a total thickness of a hole transport layer of the second light emitting unit 120.

When satisfying the conditions shown in Equation 1, each of the blue light generated from the first light emitting unit 110 and the orange light generated from the second light emitting unit 120 causes constructive interference and thus luminous efficiency may be optimized, which results in enhanced viewing angle.

Table 1 below shows measurement results of voltage (V), color coordinates (CIE_x,CIE_y), and efficiency (cd/A) of structures of comparative examples and examples according to the thicknesses of the first and second hole transport layers 114a and 114b, and Table 2 below shows measurement results of voltage (V), color coordinates (CIE_x, CIE_y), and efficiency (cd/A) of structures of comparative examples and examples according to the thicknesses of the third and fourth hole transport layers 124a and 124b. In Tables 1 and 2, HTL1, HTL2, HTL3, and HTL4 respectively denote the first, second, third and fourth hole transport layers 114a, 114b, 124a and 124b.

TABLE 1

| | structure | | | | | | | |
|---|---|---|---|---|---|---|---|---|
| | HTL1 [Å] | HTL2 [Å] | HTL3 [Å] | HTL4 [Å] | V | CIE_x | CIE_y | Cd/ACIE_xCIE_ycd/A |
| Comparative Example | 1350 | 0 | 300 | 150 | 7.5 | 0.305 | 0.319 | 50 |
| Comparative Example | 1300 | 50 | | | 7.5 | 0.307 | 0.321 | 68 |
| Example | 1200 | 150 | | | 7.5 | 0.306 | 0.322 | 75 |
| Example | 1000 | 350 | | | 7.8 | 0.309 | 0.32 | 76 |
| Example | 800 | 550 | | | 8.5 | 0.31 | 0.321 | 77 |
| Comparative Example | 600 | 750 | | | 10 | 0.311 | 0.329 | 76 |
| Comparative Example | 400 | 950 | | | 12 | 0.309 | 0.328 | 71 |
| Comparative Example | 200 | 1150 | | | 12 | 0.307 | 0.325 | 69 |
| Comparative Example | 0 | 1350 | | | 12 | 0.305 | 0.32 | 70 |

TABLE 2

| | structure | | | | | | | |
|---|---|---|---|---|---|---|---|---|
| | HTL1 [Å] | HTL2 [Å] | HTL3 [Å] | HTL4 [Å] | V | CIE_x | CIE_y | Cd/ACIE_xCIE_ycd/A |
| Comparative Example | 1200 | 150 | 450 | 0 | 7.5 | 0.311 | 0.319 | 65 |
| Comparative Example | | | 400 | 50 | 7.5 | 0.308 | 0.322 | 68 |
| Comparative Example | | | 350 | 100 | 7.5 | 0.309 | 0.329 | 72 |
| Example | | | 300 | 150 | 7.5 | 0.306 | 0.322 | 75 |
| Comparative Example | | | 250 | 200 | 7.7 | 0.308 | 0.33 | 76 |
| Comparative Example | | | 200 | 250 | 7.9 | 0.311 | 0.331 | 77 |
| Comparative Example | | | 150 | 300 | 8 | 0.301 | 0.325 | 77 |
| Comparative Example | | | 100 | 350 | 10 | 0.311 | 0.326 | 77 |
| Comparative Example | | | 50 | 400 | 10 | 0.315 | 0.327 | 70 |
| Comparative Example | | | 0 | 450 | 10 | 0.312 | 0.33 | 70 |

As shown in Table 1, as the thickness of the first hole transport layer 114a decreases and the thickness of the second hole transport layer 114b increases, driving voltage increases and, as shown in Table 2, as the thickness of the third hole transport layer 124a decreases and the thickness of the fourth hole transport layer 124b increases, driving voltage increases. Accordingly, as shown in Tables 1 and 2, the structures of examples in which the first hole transport layer 114a is formed to a thickness of about 700 Å to about 1200 Å, the second hole transport layer 114b is formed to a thickness of about 150 Å to about 250 Å, which is smaller than that of the first hole transport layer 114a, the third hole transport layer 124a is formed to a thickness of about 250 Å to about 350 Å, and the fourth hole transport layer 124b is formed to a thickness of about 100 Å to about 150 Å, which is smaller than that of the third hole transport layer 124a have enhanced characteristics, i.e., voltage (V), color coordinates (CIE_x,CIE_y), and efficiency (cd/A), when compared to those of the structures of comparative examples. In addition, in embodiments of the present invention, when efficiency increases as described above, driving current decreases and the same brightness as that of a conventional organic light emitting display device may be achieved at a relatively low current. Accordingly, the organic light emitting display device according to the present invention also has enhanced lifespan.

Figure 3:
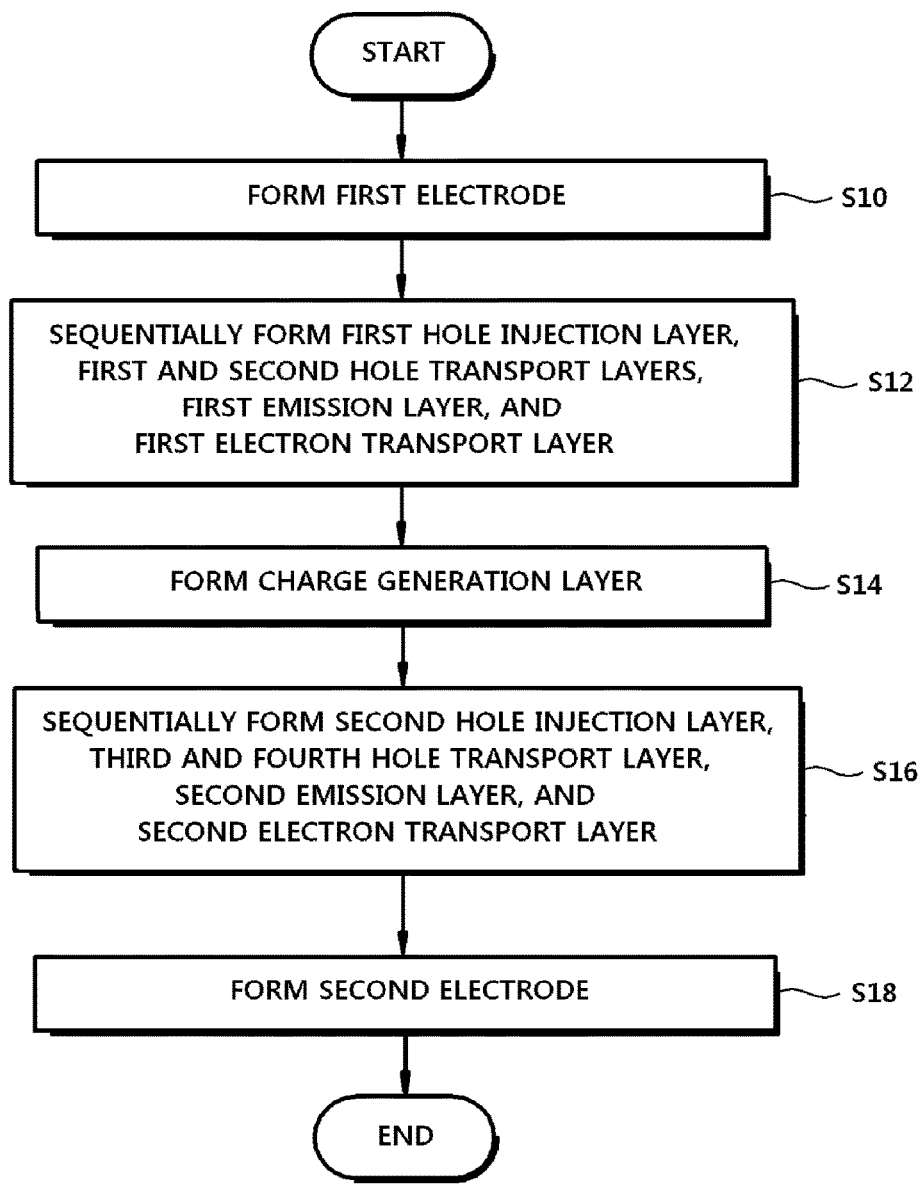
FIG. 3 is a flowchart for explaining a method of manufacturing the organic light emitting display device according to the first embodiment of the present invention.

FIG. 3 is a flowchart for explaining a method of manufacturing the organic light emitting display device according to the first embodiment of the present invention.

First, the first electrode 102 is formed on the substrate 101 (step S10). The hole injection layer 112, the first and second hole transport layers 114a and 114b, the first emission layer 116, and the first electron transport layer 118 are sequentially stacked on the substrate 101 with the first electrode 122 formed thereon by thermal deposition, sputtering, or a combination thereof to form the first light emitting unit 110 (step S12). Thereafter, the charge generation layer 130 is formed on the first light emitting unit 110 (step S14). Next, the third and fourth hole transport layers 124a and 124b, the second emission layer 126, and the second electron transport layer 128 are sequentially stacked on the substrate 101 with the charge generation layer 130 formed thereon by thermal deposition, sputtering, or a combination thereof to form the second light emitting unit 120 (step S16). Thereafter, the second electrode 104 is formed on the substrate 101 with the second light emitting unit 120 formed thereon (step S18).

Figure 4:
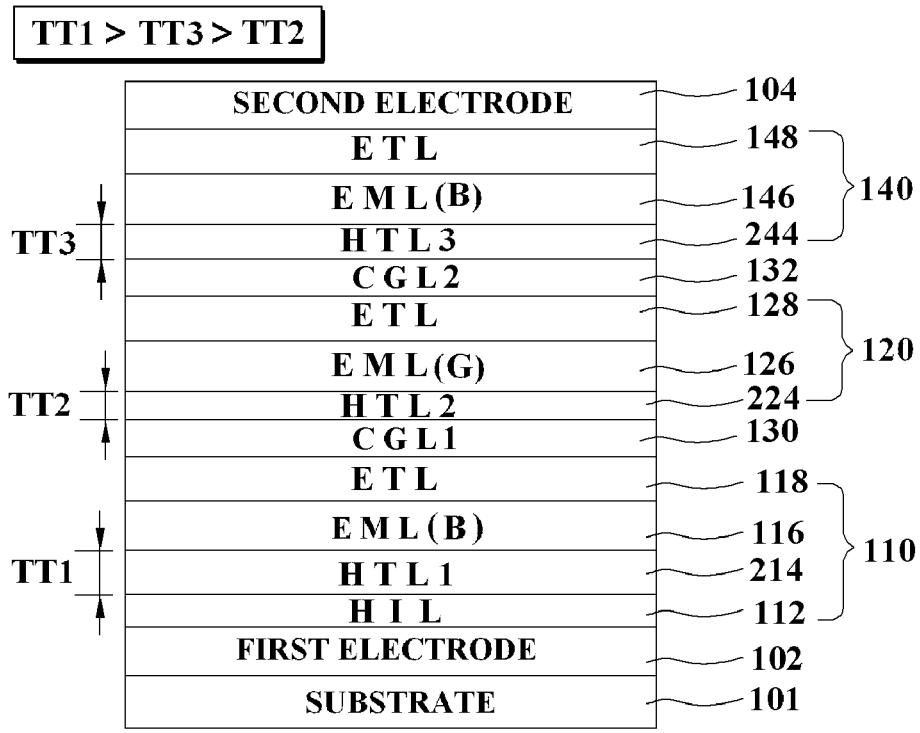
FIG. 4 is a sectional view of an organic light emitting display device according to a second embodiment of the present invention.
Figure 5:
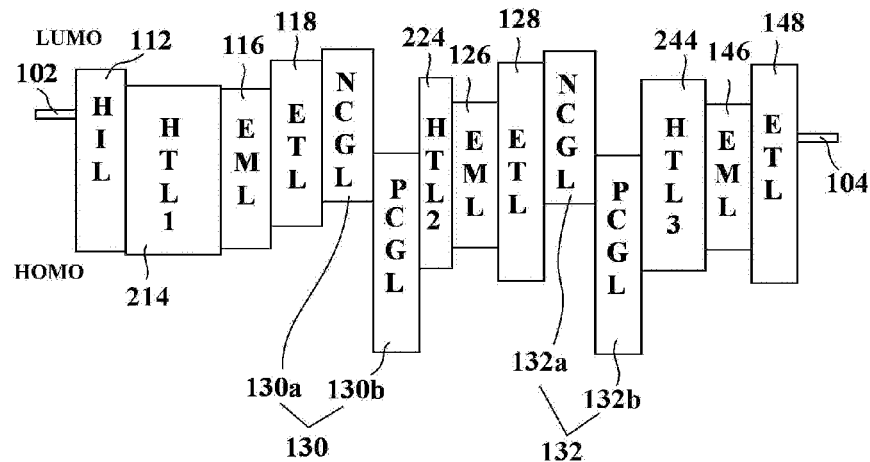
FIG. 5 is a band diagram illustrating the organic light emitting display device illustrated in FIG. 4.

FIG. 4 is a block diagram illustrating an organic light emitting display device according to a second embodiment of the present invention. FIG. 5 is a band diagram illustrating the organic light emitting display device illustrated in FIG. 4.

The organic light emitting display device of FIGS. 4 and 5 includes the same elements as those of the organic light emitting display device of FIG. 1, except that the organic light emitting display device of FIGS. 4 and 5 further includes a second charge generation layer 132 including an N-type charge generation layer 132a and a P-type charge generation layer 132b and a third light emitting unit 140. Thus, a detailed description of the same elements will be omitted herein.

That is, the organic light emitting display device of FIG. 4 includes the first and second electrodes 102 and 104 facing each other, the first, second and third light emitting units 110, 120 and 140 formed between the first and second electrodes 102 and 104, a first charge generation layer 130 formed between the first and second light emitting units 110 and 120, and the second charge generation layer 132 formed between the second and third light emitting units 120 and 140.

The first light emitting unit 110 includes the hole injection layer 112, a first hole transport layer 214, the first emission layer 116 to emit blue light, and the first electron transport layer 118 that are sequentially formed on the first electrode 102. In particular, the first hole transport layer 214 supplies holes from the first electrode 102 to the first emission layer 116 and controls cavity of blue light generated from the first light emitting unit 110.

The second light emitting unit 120 is formed between the first and third light emitting units 110 and 140. The second light emitting unit 120 includes a second hole transport layer 224, the second emission layer 126 to emit green light, and the second electron transport layer 128 that are sequentially formed on the first charge generation layer 130 disposed on the first light emitting unit 110. In particular, the second hole transport layer 224 supplies holes from the first charge generation layer 130 to the second emission layer 126 and controls cavity of green light generated from the second light emitting unit 120.

The third light emitting unit 140 is formed between the second charge generation layer 132 and the second electrode 104. The third light emitting unit 140 includes a third hole transport layer 244, a third emission layer 146 to emit blue light, and a third electron transport layer 148 that are sequentially formed on the second charge generation layer 132. In particular, the third hole transport layer 244 supplies holes from the second charge generation layer 132 to the third emission layer 146 and controls cavity of blue light generated from the third light emitting unit 140.

Figure 6:
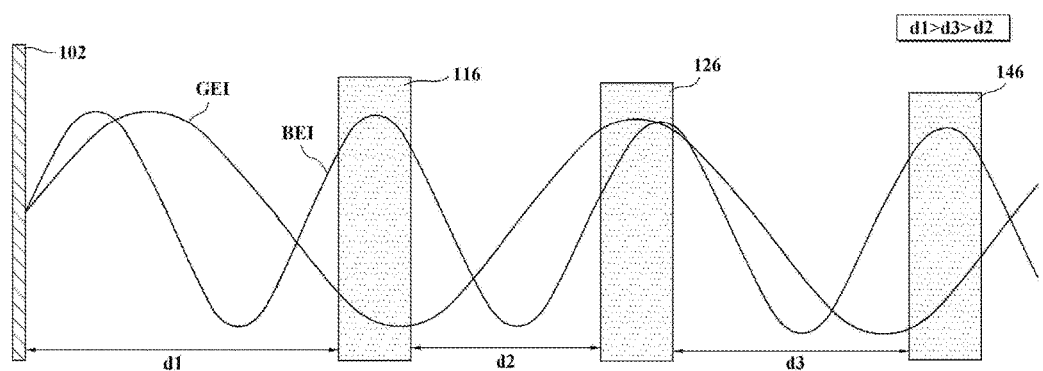
FIG. 6 illustrates electroluminescence intensities of green light and blue light generated from first, second and third emission layers illustrated in FIGS. 4 and 5.

In particular, blue light generated from the first and third light emitting units 110 and 140 is repeatedly refracted and reflected within a resonance region between the first and second electrodes 102 and 104. That is, due to a microcavity effect whereby blue light generated from each of the first and third emission layers 116 and 146 and blue light reflected by the first electrode 102 undergo constructive interference, as illustrated in FIG. 6, blue electroluminescence intensity (BEI) characteristics are exhibited within the resonance region between the first and second electrodes 102 and 104. The BEI has plural blue electroluminescence peaks within the resonance region between the first and second electrodes 102 and 104.

In addition, green light generated from the second light emitting unit 120 is repeatedly refracted and reflected within the resonance region between the first and second electrodes 102 and 104. That is, due to a microcavity effect whereby green light generated from the second emission layer 126 and green light reflected by the first electrode 102 undergo constructive interference, as illustrated in FIG. 6, green electroluminescence intensity (GEI) characteristics are exhibited within the resonance region between the first and second electrodes 102 and 104. In this regard, since green light has a longer peak wavelength than that of blue light, the GEI has a smaller number of plural green electroluminescence peaks than that of the BEI within the resonance region between the first and second electrodes 102 and 104.

In this regard, when blue emission layers (e.g., the first and third emission layers 116 and 146) are disposed at a blue electroluminescence peak position and a green emission layer (e.g., the second emission layer 126) is disposed at a green electroluminescence peak position, highest luminous efficiency may be obtained.

Accordingly, a position of the first emission layer 116 to generate blue light is determined by adjusting the thicknesses of the hole injection layer 112 and the first hole transport layer 214 that are disposed below the first emission layer 116. Preferably, a distance d1 from an upper surface of the first electrode 102 to a lower surface of the first emission layer 116, i.e., a sum of the thicknesses of the hole injection layer 112 and the first hole transport layer 214 that are disposed below the first emission layer 116, is between 1200 and 1400 Å.

A position of the second emission layer 126 to generate green light is determined by adjusting the thicknesses of the electron transport layer 118, the first charge generation layer 130, and the second hole transport layer 224, disposed between the first and second emission layers 116 and 126. Preferably, a distance d2 from an upper surface of the first emission layer 116 to a lower surface of the second emission layer 126, i.e., a sum of the thicknesses of the electron transport layer 118, the first charge generation layer 130, and the second hole transport layer 224, disposed between the first and second emission layers 116 and 126, is between 400 and 600 Å.

In addition, a position of the third emission layer 146 to generate blue light is determined by adjusting the thicknesses of the electron transport layer 128, the second charge generation layer 132, and the third hole transport layer 244, disposed between the second and third emission layers 126 and 146. Preferably, a distance d3 from an upper surface of the second emission layer 126 to a lower surface of the third emission layer 146, i.e., a sum of the thicknesses of the electron transport layer 128, the second charge generation layer 132, and the third hole transport layer 244, disposed between the first and second emission layers 116 and 126, is between 1210 and 1350 Å.

In particular, to determine the positions of the first, second and third emission layers 116, 126 and 146 since driving voltage may increase when the thicknesses of the electron transport layers 118, 128 and 148 are adjusted, it is preferable to adjust the thicknesses of the first, second and third hole transport layers 214, 224 and 244 that do not affect driving voltage.

That is, in the organic light emitting display device according to the present invention, the thicknesses of the first, second and third hole transport layers 214, 224 and 244 satisfy the conditions shown in Equation 2 below.

$$TT1 > TT3 > TT2 \qquad \text{[Equation 2]}$$

In Equation 2, TT1 denotes the thickness of the first hole transport layer 214 of the first light emitting unit 110, TT2 denotes the thickness of the second hole transport layer 224 of the second light emitting unit 120, and TT3 denotes the thickness of the third hole transport layer 244 of the third light emitting unit 140. In this regard, the thickness of the first hole transport layer 214 is greater than about 1050 Å to less than 1450 Å, the thickness of the second hole transport layer 224 is 200 Å to 600 Å, and the thickness of the third hole transport layer 244 is 800 Å to 1000 Å.

Accordingly, as illustrated in FIG. 6, the first emission layer 116 of the first light emitting unit 110 is located at a second electroluminescence peak of the BEI wavelength, the second emission layer 126 of the second light emitting unit 120 is located at a second electroluminescence peak of the GEI wavelength, and the third emission layer 146 of the third light emitting unit 140 is located at a third electroluminescence peak of the BEI wavelength.

Consequently, each of the blue light generated from the first light emitting unit 110, the green light generated from the second light emitting unit 120, and the blue light generated from the third light emitting unit 140 causes constructive interference, thereby generating white light having a maximum luminous efficiency.

Meanwhile, although a case in which the first and third emission layers 116 and 146 generate blue light and the second emission layer 126 generates green light has been described in the second embodiment of the present invention by way of example, a structure in which the first emission layer 116 generates green light and the second and third emission layers 126 and 146 generate blue light or a structure in which the first and second emission layers 116 and 126 generate blue light and the third emission layer 146 generates green light may also be applied.

In addition, a position of each of the first, second and third hole transport layers 214, 224 and 244, i.e., a position of a lower surface of each of the first, second and third hole transport layers 214, 224 and 244, may vary according to the thickness of the first electrode 102 formed on the substrate 101, but a thickness order of the first, second and third hole transport layers 214, 224 and 244 is not changed.

Table 3 shows efficiency characteristics of the organic light emitting display device according to the second embodiment of the present invention and organic light emitting display devices of comparative examples 1 and 2.

TABLE 3

|  | Example 2 [TT1 > TT3 > TT2] | | | Comparative Example 1 [TT3 > TT1 > TT2] | | Comparative Example 2 [TT1 > TT2 > TT3] | |
| --- | --- | --- | --- | --- | --- | --- | --- |
|  | A | B | C | D | E | F | G |
| TT1 [Å] | 1150 | 1250 | 1350 | 1050 | 750 | 1250 | 1250 |
| TT2 [Å] | 250 | 250 | 250 | 250 | 250 | 650 | 750 |
| TT3 [Å] | 1050 | 950 | 850 | 1150 | 1450 | 550 | 450 |
| Efficiency [cd/A] | 75 | 80 | 74 | 65 | 66 | 30 | 40 |

Figure 7A:
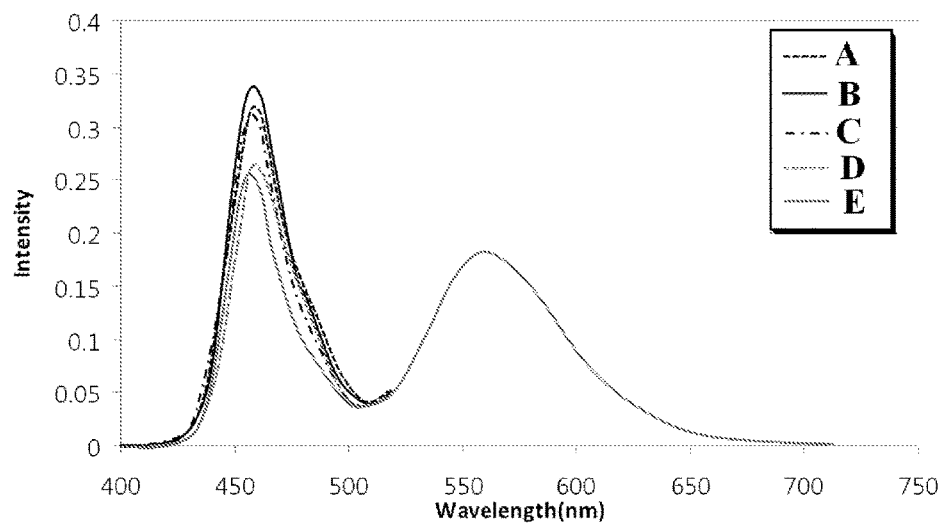
FIGS. 7A and 7B are graphs for explaining an electroluminescence peak of the organic light emitting display device of FIG. 4.

As shown in Table 3 and FIG. 7A, the organic light emitting display device of comparative example 1 in which the thickness TT3 of a third hole transport layer of a third light emitting unit is the greatest and the thickness TT2 of a second hole transport layer of a second light emitting unit is the smallest has a smaller electroluminescence peak value than that of the organic light emitting display device according to the second embodiment of the present invention and thus exhibits reduced efficiency characteristics, by 20% or greater.

Figure 7B:
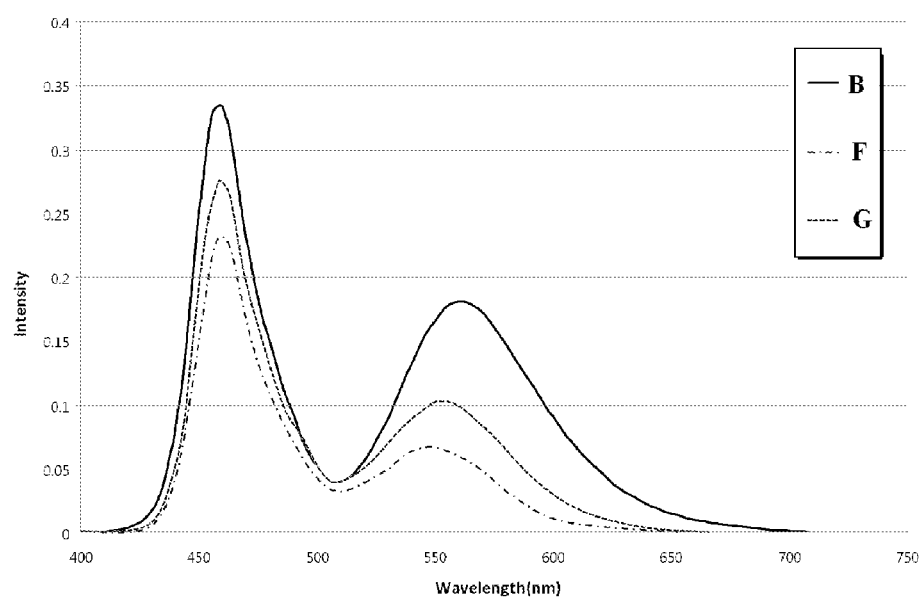

In addition, as shown in Table 3 and FIG. 7B, the organic light emitting display device of comparative example 2 in which the thickness TT1 of a first hole transport layer of a third light emitting unit is the greatest and the thickness TT3 of a third hole transport layer of a third light emitting unit is the smallest has a smaller electroluminescence peak value than that of the organic light emitting display device according to the second embodiment of the present invention and thus exhibits reduced efficiency characteristics, by 20% or greater.

FIG. 8 is a flowchart for explaining a method of manufacturing the organic light emitting display device according to the second embodiment of the present invention.

First, the first electrode 102 is formed on the substrate 101 (step S20). The hole injection layer 112, the first hole transport layer 214, the first emission layer 116, and the first electron transport layer 118 are sequentially stacked on the substrate 101 with the first electrode 122 formed thereon by thermal deposition, sputtering, or a combination thereof to form the first light emitting unit 110 (step S22). Thereafter, the first charge generation layer 130 is formed on the first light emitting unit 110 (step S24). Next, the second hole transport layer 224, the second emission layer 126, and the second electron transport layer 128 are sequentially stacked on the substrate 101 with the first charge generation layer 130 formed thereon by thermal deposition, sputtering, or a combination thereof to form the second light emitting unit 120 (step S26). Thereafter, the second charge generation layer 132 is formed on the second light emitting unit 120 (step S28). The third hole transport layer 244, the third emission layer 146, and the third electron transport layer 148 are sequentially stacked on the substrate 101 with the second charge generation layer 132 formed thereon by thermal deposition, sputtering, or a combination thereof to form the third light emitting unit 140 (step S30). The second electrode 104 is formed on the substrate 101 with the third light emitting unit 140 formed thereon (step S32).

Although a case in which the first, second and third hole transport layers 214, 224 and 244 of the respective first, second and third light emitting units 110, 120 and 140 have a single layer structure has been described by way of example in the second embodiment of the present invention, as in the first embodiment of the present invention, the first, second and third hole transport layers 214, 224 and 244 of the respective first, second and third light emitting units 110, 120 and 140 may have a multilayer structure.

Figure 9:
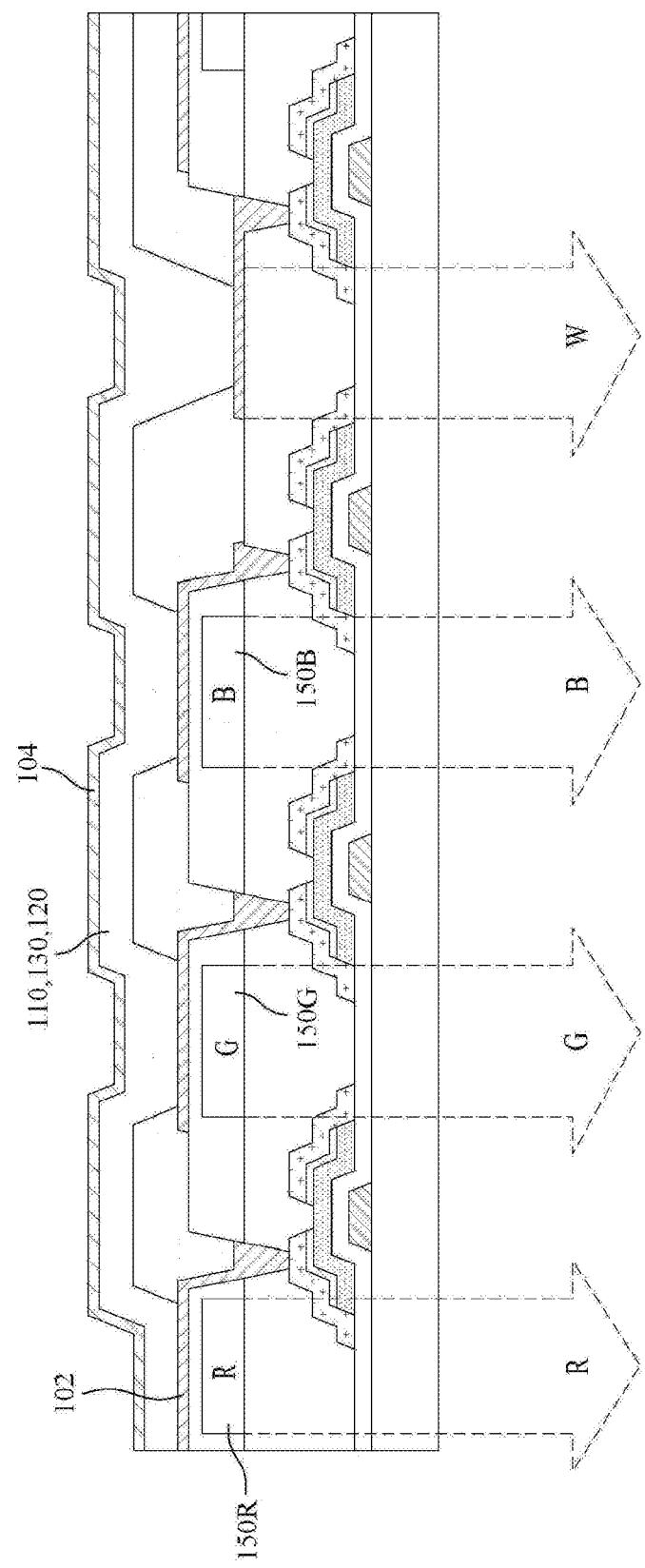
FIG. 9 is a sectional view of the organic light emitting display device according to the first or second embodiment of the present invention including color filters.

Meanwhile, the organic light emitting display devices according to the first and second embodiments of the present invention may be applied to a structure having red, green and blue color filters 150R, 150G and 150B as illustrated in FIG. 9. That is, white light generated via the first and second light emitting units 110 and 120 illustrated in FIG. 1 or white light generated via the first, second and third light emitting units 110, 120 and 140 illustrated in FIG. 4 is emitted as red light while passing through a sub-pixel region provided with the red color filter 150R, is emitted as green light while passing through a sub-pixel region provided with the green color filter 150G, is emitted as blue light while passing through a sub-pixel region provided with the blue color filter 150B, and is emitted unchanged while passing through a sub-pixel region not provided with a color filter.

As is apparent from the foregoing description, according to organic light emitting display devices according to the present invention and methods of manufacturing the same, a hole transport layer included in each of a plurality of light emitting units is formed to different thicknesses. Accordingly, the organic light emitting display device manufactured using the method has increased efficiency and lifespan and enhanced viewing angle.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
   a first electrode and a second electrode facing each other on a substrate;
   a first charge generation layer and a second charge generation layer between the first electrode and the second electrode;
   a first light emitting unit comprising a first emission layer between the first electrode and the first charge generation layer, a first hole transport layer supplying holes from the first electrode to the first emission layer, and a first electron transport layer supplying electrons from the first charge generation layer to the first emission layer;
   a second light emitting unit comprising a second emission layer between the second electrode and the first charge generation layer, a second hole transport layer supplying holes from the first charge generation layer to the second emission layer, and a second electron transport layer supplying electrons from the second electrode to the second emission layer; and
   a third light emitting unit comprising a third emission layer formed between the second electrode and the second charge generation layer, a third hole transport layer supplying holes from the second charge generation layer to the third emission layer, and a third electron transport layer supplying electrons to the third emission layer, and
   wherein a total thickness of the first hole transport layer of the first light emitting unit is greater than a thickness of the third hole transport layer of the third light emitting unit, and the thickness of the third hole transport layer of the third light emitting unit is greater than a thickness of the second hole transport layer of the second light emitting unit.

2. The organic light emitting display device according to claim 1, wherein the thickness of the first hole transport layer of the first light emitting unit is greater than 1050 Å and less than 1450 Å, wherein the thickness of the second hole transport layer of the second light emitting unit is between 200 and 600 Å, and the thickness of the third hole transport layer of the third light emitting unit is between 800 and 1000 Å.

3. The organic light emitting display device according to claim 1, wherein two of the first, second, and third emission layers realize blue color, and the other thereof realizes green color.

* * * * *